US012783906B2

(12) United States Patent
Zhang et al.

(10) Patent No.: US 12,783,906 B2
(45) Date of Patent: Nov. 3, 2026

(54) MODEL VERIFICATION DEVICE AND MODEL VERIFICATION METHOD

(71) Applicant: Inter-University Research Institute Corporation Research Organization of Information and Systems, Tokyo (JP)

(72) Inventors: Zhenya Zhang, Tokyo (JP); Paolo Arcaini, Tokyo (JP); Ichiro Hasuo, Tokyo (JP)

(73) Assignee: INTER-UNIVERSITY RESEARCH INSTITUTE CORPORATION RESEARCH ORGANIZATION OF INFORMATION AND SYSTEMS, Tokyo (JP)

( * ) Notice: Subject to any disclaimer, the term of this patent is extended or adjusted under 35 U.S.C. 154(b) by 1029 days.

(21) Appl. No.: 17/456,921

(22) Filed: Nov. 30, 2021

(65) Prior Publication Data

US 2022/0180213 A1 Jun. 9, 2022

(30) Foreign Application Priority Data

Dec. 8, 2020 (JP) ................................ 2020-203366

(51) Int. Cl.
*G06F 30/3323* (2020.01)
*G06N 5/01* (2023.01)

(52) U.S. Cl.
CPC ......... *G06N 5/013* (2023.01); *G06F 30/3323* (2020.01)

(58) Field of Classification Search
None
See application file for complete search history.

(56) References Cited

U.S. PATENT DOCUMENTS

| | | | | |
|---|---|---|---|---|
| 2014/0093030 | A1* | 4/2014 | Mukumoto | A61B 6/486 378/4 |
| 2015/0276908 | A1* | 10/2015 | Takeshima | G01R 33/5611 324/322 |
| 2016/0078539 | A1* | 3/2016 | Ignatovich | G06Q 40/04 705/37 |
| 2016/0216708 | A1* | 7/2016 | Krivoshein | G05D 1/0088 |
| 2016/0292307 | A1* | 10/2016 | Fainekos | G06F 30/00 |
| 2018/0324154 | A1* | 11/2018 | Crabtree | H04L 9/3236 |
| 2020/0151291 | A1* | 5/2020 | Bhattacharyya | G06N 3/0499 |
| 2020/0409359 | A1* | 12/2020 | Kapinski | G06N 3/0499 |
| 2021/0360005 | A1* | 11/2021 | Bae | G06F 11/3604 |
| 2024/0005633 | A1* | 1/2024 | Zhang | G06F 18/214 |

OTHER PUBLICATIONS

A. Donze and O. Maler, "Robust satisfaction of temporal logic over real-valued signals", in Proc 8th Int. Conf. Formal Model. Anal. Timed Syst. vol. 6246, 2010, pp. 92-106.

* cited by examiner

*Primary Examiner* — Xuyang Xia
(74) *Attorney, Agent, or Firm* — IPUSA, PLLC

(57) ABSTRACT

A model verification device includes a memory, and a processor coupled to the memory and configured to extract a sample from a search space, transform the extracted sample into an input on a constrained search space to which a constraint with respect to a model is applied, according to a predetermined transform rule; and determine whether an output of the model for the input satisfies a specification, and determine the input as a counterexample when the output does not satisfy the specification.

7 Claims, 7 Drawing Sheets

MODEL VERIFICATION DEVICE AND MODEL VERIFICATION METHOD

CROSS-REFERENCE TO RELATED APPLICATIONS

This application is based upon and claims priority to Japanese Patent Application No. 2020-203366 filed on Dec. 8, 2020, the entire contents of which are incorporated herein by reference.

BACKGROUND

1. Technical Field

The present disclosure relates to a model verification device and a model verification method.

2. Description of the Related Art

In a hybrid system having physical and digital components, verification is difficult because, when performing formal verification, a search range is infinite. As a proposed verification method, falsification, which searches for counterexamples that violate a specification of the hybrid system, is known.

Typical falsification searches, with respect to a hybrid model M as a black box model and a specification φ to be satisfied by the hybrid model M, for an input u* (a counterexample) to the hybrid model M that does not satisfy the specification φ by using stochastic hill climbing and the like.

In model verification, a constraint ψ may be applied to the input to the model M. For example, in an automobile speed control model that receives values of the accelerator and the brake as an input and that outputs the automobile speed as an output, both the accelerator and the brake do not operate at the same time. Thus, a constraint ψ that excludes such a case is applied to a search range of combinations of the input values of the accelerator and the brake for searching for a counterexample.

As solutions to such a counterexample search problem in which a constraint is applied to the input, a constraint embedding (CE) method and a lexicographic (LM) method are known. However, these solutions also perform sampling in an area of a search space that does not satisfy the constraint, resulting in larger computational overhead.

It is desirable to provide an efficient model verification technique for a constrained search space.

SUMMARY

According to one aspect of an embodiment, a model verification device includes a memory, and a processor coupled to the memory and configured to extract a sample from a search space, transform the extracted sample into an input on a constrained search space to which a constraint with respect to a model is applied, according to a predetermined transform rule; and determine whether an output of the model for the input satisfies a specification, and determine the input as a counterexample when the output does not satisfy the specification.

According to at least one embodiment of the present disclosure, an efficient model verification technique for a constrained search space can be provided.

DETAILED DESCRIPTION

In the following embodiment, a model verification device that verifies the degree of the satisfaction of a model, such as a cyber-physical system, with respect to a specification for a constrained input is disclosed.

[Outline]

Figure 1:
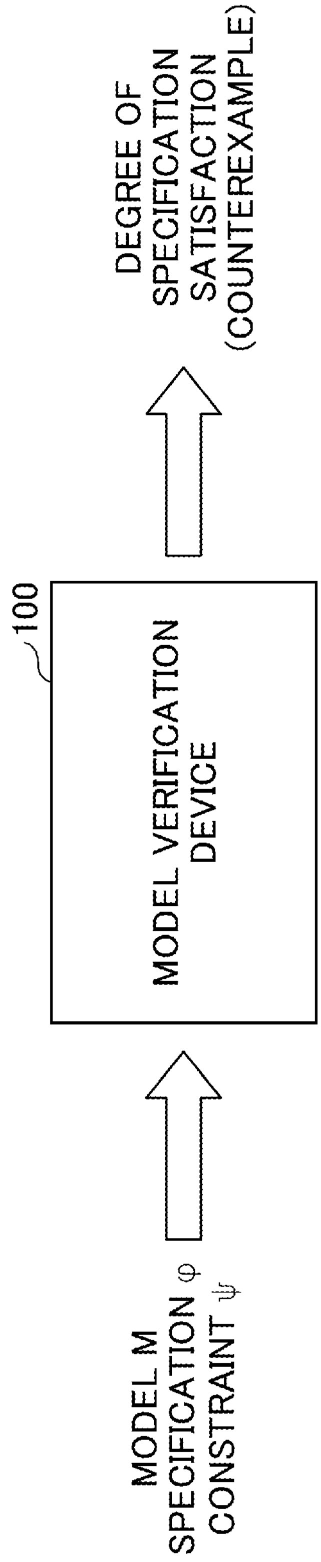
FIG. 1 is a schematic diagram illustrating a model verification device according to an embodiment of the present disclosure.

A model verification device 100 according to an embodiment of the present disclosure, as illustrated in FIG. 1, verifies, with respect to a model M, a specification φ, and a constraint ψ, whether there is a counterexample u* that does not satisfy the specification φ among outputs M(u) of the model M that correspond to inputs u that satisfy the constraint ψ. Typically, the model M may be a cyber-physical system model having a black-box internal structure and observable only for an input/output relationship. In order to facilitate the search for the input u that satisfies the constraint ψ, in the present disclosure, the model verification device 100 performs a search space transformation on an input area U (i.e., a search space U) of the model M that satisfies the constraint ψ, forms a less constrained search space X suitable for a search algorithm, and searches for a sample x used to extract a counterexample u* on the search space X according to a search algorithm such as hill climbing.

Figure 2A:
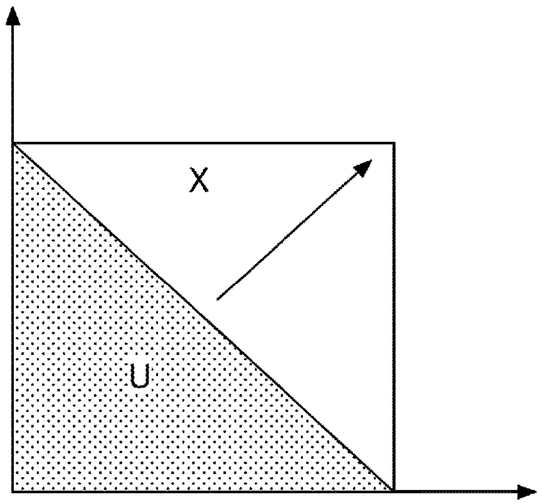
FIG. 2A and FIG. 2B are schematic diagrams illustrating a space transformation according to the embodiment of the present disclosure.
Figure 2B:
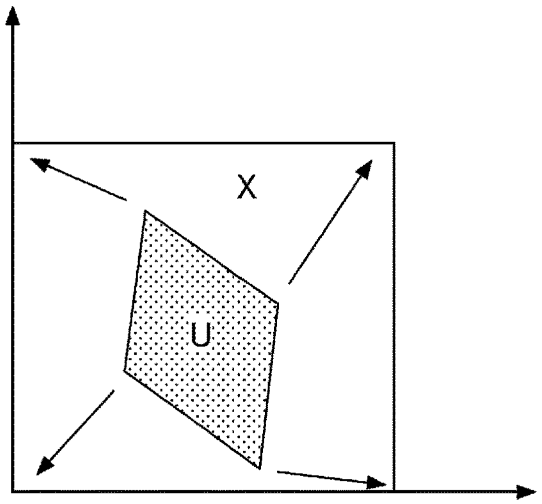

For example, as illustrated in FIG. 2A and FIG. 2B, the search space U that satisfies the constraint ψ is spatially transformed into the square search space X. In the specific example illustrated in FIG. 2A, intuitively, the constrained search space U formed in an isosceles right triangle is extended and spatially transformed into the square search space X suitable for the search algorithm. In the specific example illustrated in FIG. 2B, intuitively, a diamond-shaped constrained search space U is extended and spatially transformed into the square search space X. These space transformations can be achieved by proportional transformations.

Figure 3:
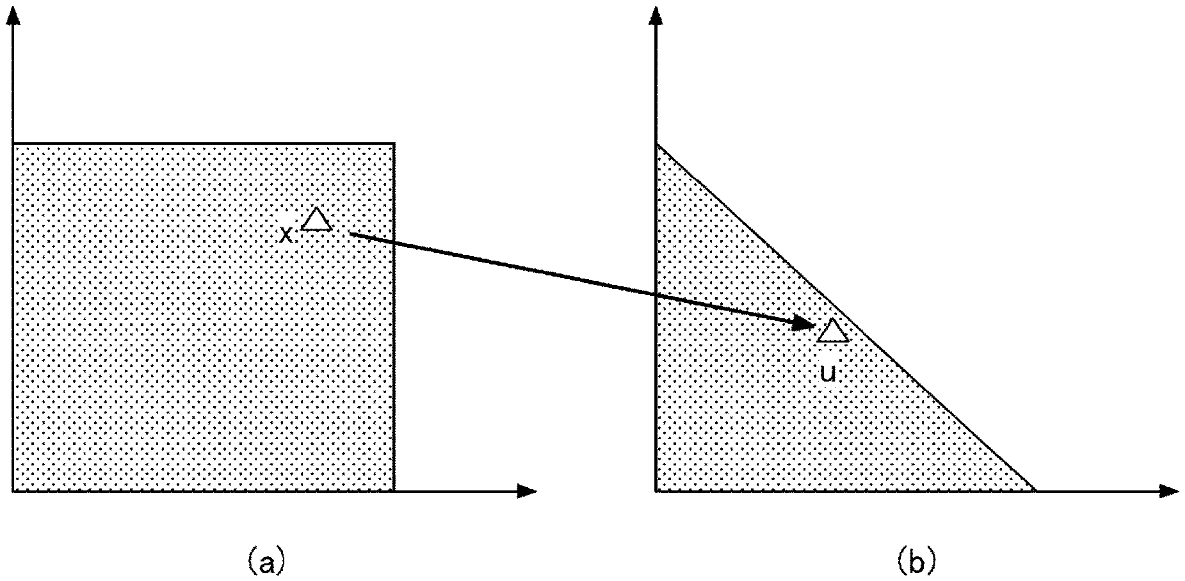
FIG. 3 is a schematic diagram illustrating a transformation from a sample x to an input u according to the embodiment of the present disclosure.

As described, when a transformation rule from the constrained search space U to the search space X suitable for the search algorithm is determined, the model verification device 100 searches for the sample x based on a search algorithm such as hill climbing in the search space X formed in a square shape or a rectangular shape (referred to as a hypercube or a hyperrectangle, respectively, in a space of three or more dimensions) as illustrated in FIG. 3, instead of sampling the input u in the constrained search space U having a shape corresponding to the constrained condition ψ, and the extracted sample x is transformed into a point u on the constrained search space U. As described, by performing sampling on the unconstrained search space X, the degree of freedom of the search range required for the search of the hill climbing can be obtained, and by transforming the sample x extracted on the search space X into the input u on the constrained search space U, the efficient model verification for the input u to which the constraint condition is applied can be achieved.

Figure 4:
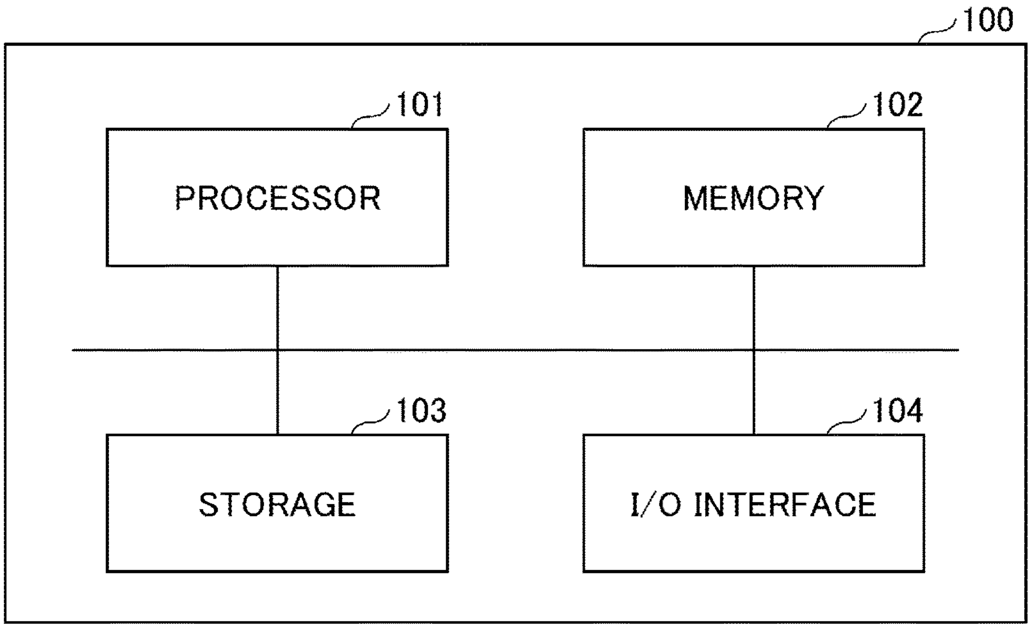
FIG. 4 is a block diagram illustrating a hardware configuration of a model verification device according to the embodiment of the present disclosure.

Here, the model verification device 100 may have, for example, a hardware configuration in which a processor 101 such as a central processing unit (CPU), a memory 102, such as a random access memory (RAM) and a flash memory, a storage 103, such as a hard disk drive, and an input/output (I/O) interface 104 are included, as illustrated in FIG. 4.

The processor 101 performs various processes of the model verification device 100, which will be described later.

The memory 102 stores various data and programs in the model verification device 100 and functions as a working memory, particularly for working data, a running program, and the like. Specifically, the memory 102 stores a program for executing and controlling various processes described later that is loaded from the storage 103, and functions as a working memory while the program is executed by the processor 101.

The storage 103 stores various data and programs in the model verification device 100.

The I/O interface 104 receives an instruction from a user and input data, displays an output result, plays back the output result, and the like, and is an interface for inputting data to an external device and receiving data output from the external device. For example, the I/O interface 104 may be a device that inputs and outputs various data such as a Universal Serial Bus (USB) device, a communication line, a keyboard, a mouse, a display, a microphone, a speaker, and the like.

However, the model verification device 100 according to the present disclosure is not limited to the hardware configuration described above, and may have any other suitable hardware configuration. For example, one or more of the various processes performed by the model verification device 100 may be implemented by a processing circuit or an electronic circuit wired to achieve the one or more of the various processes.

[Model Verification Device]

Next, the model verification device 100 according to the embodiment of the present disclosure will be described with reference to FIGS. 5 to 8. In the following embodiment, the model verification device 100 searches for a counterexample u* that does not satisfy the specification φ "the automobile speed is always less than 100 from 0 to 29 seconds, or the automobile speed is always greater than 75 from 29 to 30 seconds ($alw_{[0,29]}$ (speed <100)$\vee$$alw_{[29,30]}$ (speed >75)" in an automobile control model M that receives two parameters of the accelerator (throttle) and the brake as an input and that outputs three parameters of the automobile speed, the engine speed, and the gear as an output.

Throttle and brake values are each normalized from 0 to 100, and the two input parameters satisfy the constraint ψ "the accelerator and the brake do not operate simultaneously ($\wedge_{i=1}$ (uthri=0$\vee$ubrki=0)) (i=1, . . . , 5)" at each sampling opportunity i. Under such an assumption, the model verification device 100 searches, as the counterexample u*, for an output M(u*) of the model M that does not satisfy the specification φ for the input u=(uthr1, ubrk1, uthr2, ubrk2, uthr3, ubrk3, uthr4, ubrk4, uthr5, and ubrk5) (here, the sampling interval is 6 seconds) that follows the constraint.

Figure 5:
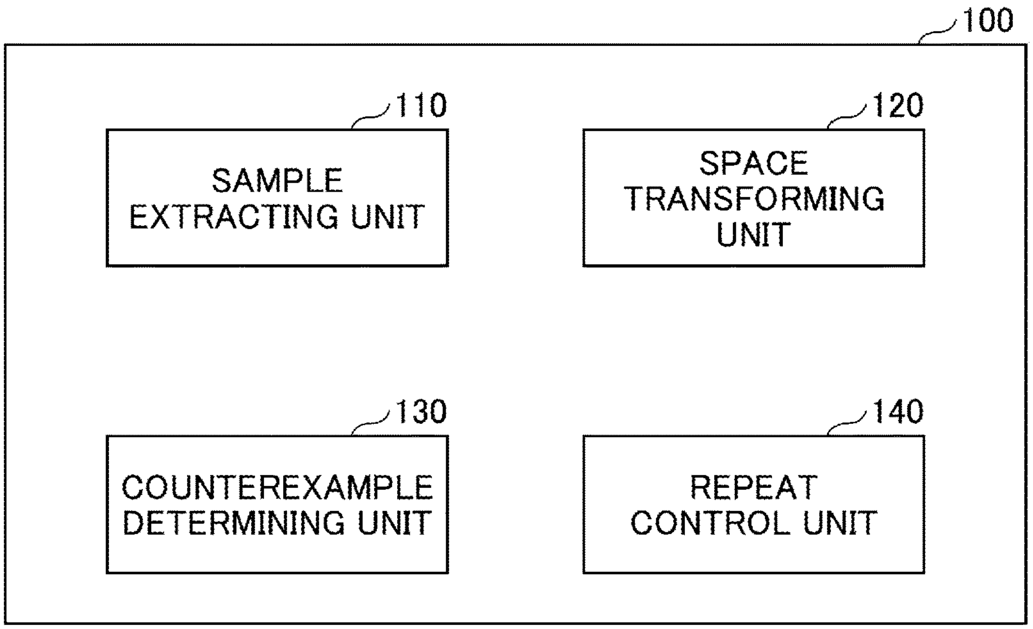
FIG. 5 is a block diagram illustrating a functional configuration of a model verification device according to the embodiment of the present disclosure.

FIG. 5 is a block diagram illustrating a functional configuration of the model verification device 100 according to the embodiment of the present disclosure. As illustrated in FIG. 5, the model verification device 100 includes a sample extracting unit 110, a space transforming unit 120, a counterexample determining unit 130, and a repeat control unit 140.

The sample extracting unit 110 extracts a sample x from the search space. The sample extracting unit 110 may randomly extract the sample x from the search space initially, and, after obtaining an evaluation result for the sample x, extract a next sample x' according to the search algorithm based on the evaluation result.

In one embodiment, the search space may be a simple search space, such as a hyperrectangle, a hypercube, or the like, suitable for the application of the search algorithm such as hill climbing. In the present embodiment, the model verification device 100 searches for the counterexample when two inputs of values of the accelerator and the brake are sampled five times, and thus the constrained search space U is an area on a ten-dimensional vector space. Therefore, the unconstrained search space X, to which the constraint ψ is not applied, may be set, for example, as a hypercube or a hyperrectangle on the 10-dimensional vector space. For example, in a case where the unconstrained search space X is the hypercube defined by a closed interval of [0, 100] for the accelerator axis and a closed interval of [0, 100] for the brake axis, the sample extracting unit 110 extracts points in the hypercube as the sample x=(xthr1, xbrk1, xthr2, xbrk2, xthr3, xbrk3, xthr4, xbrk4, xthr5, xbrk5) and supplies the sample x to the space transforming unit 120.

The space transforming unit 120 transforms the extracted sample x into the input u on the constrained search space U to which the constraint ψ with respect to the model M is applied, according to a predetermined transformation rule. That is, in a case where the search space X is a hypercube or a hyperrectangle, a transformation from the search space X to the constrained search space U can be defined as a proportional transformation, and the space transforming unit 120 transforms the sample x into the input u according to a predefined proportional transformation and supplies the input u to the counterexample determining unit 130.

Figure 6:
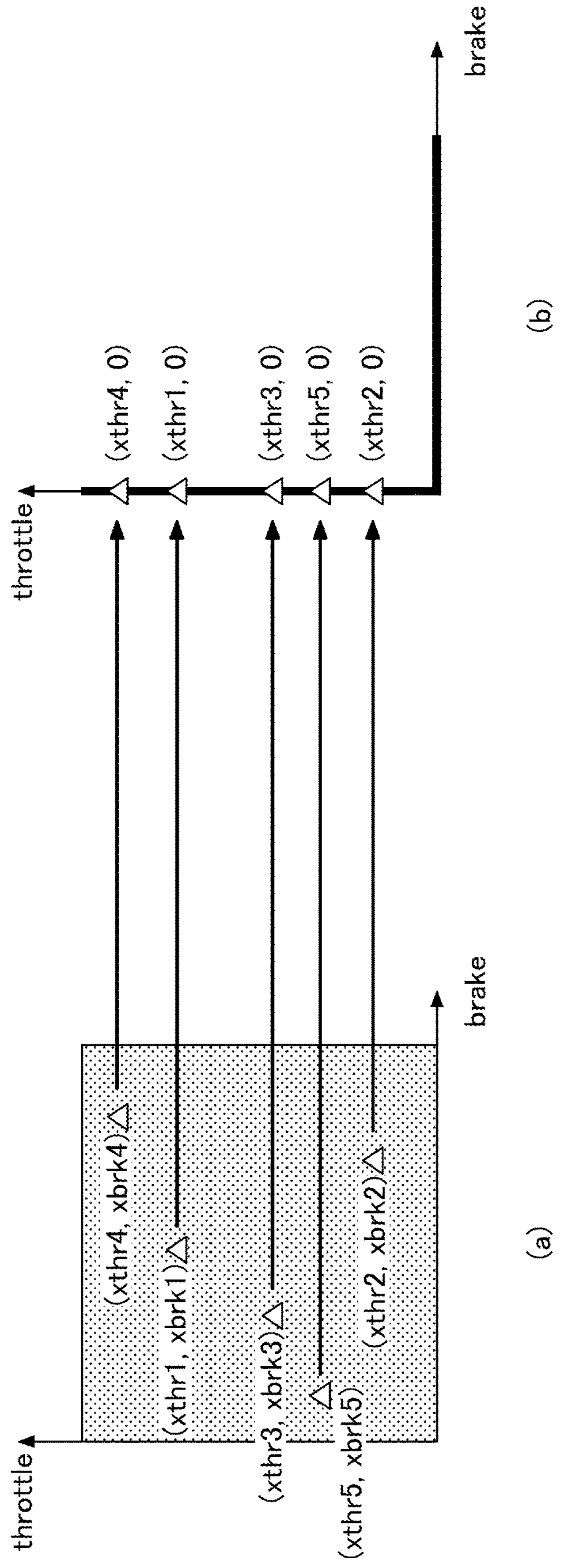
FIG. 6 is a schematic diagram illustrating a proportional transformation according to the embodiment of the present disclosure.

In one embodiment, the space transforming unit 120 may perform a proportional transformation on the sample x to transform the sample x into the input u according to an axis priority given as a hyperparameter. Specifically, if the axis priority is defined to prioritize the accelerator axis, the space transforming unit 120 transforms the sample x=(xthr1, xbrk1, xthr2, xbrk2, xthr3, xbrk3, xthr4, xbrk4, xthr5, xbrk5) into the input u=(xthr1, 0, xthr2, 0, xthr3, 0, xthr4, 0, xthr5, 0) and transforms the sample x to the points on the accelerator axis of the constrained search space, as illustrated in FIG. 6.

Figure 7:
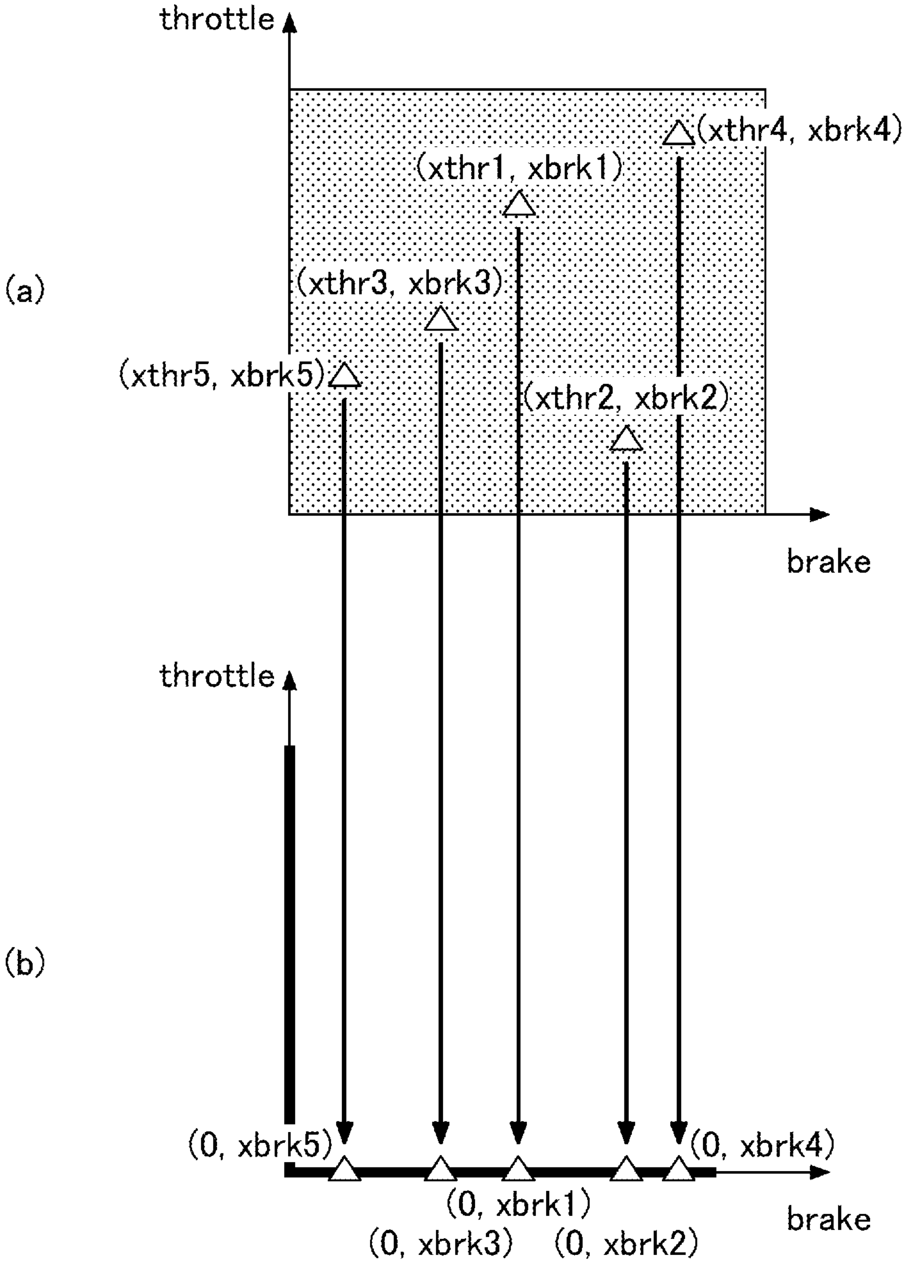
FIG. 7 is a schematic diagram illustrating a proportional transformation according to the embodiment of the present disclosure.

If the axis priority is defined to prioritize the brake axis, the space transforming unit 120 transforms the sample x=(xthr1, xbrk1, xthr2, xbrk2, xthr3, xbrk3, xthr4, xbrk4, xthr5, xbrk5) into u=(0, xbrk1, 0, xbrk2, 0, xbrk3, 0, xbrk4, 0, xbrk5) and transforms the sample x to the points on the brake axis of the constrained search space, as illustrated in FIG. 7.

Figure 8:
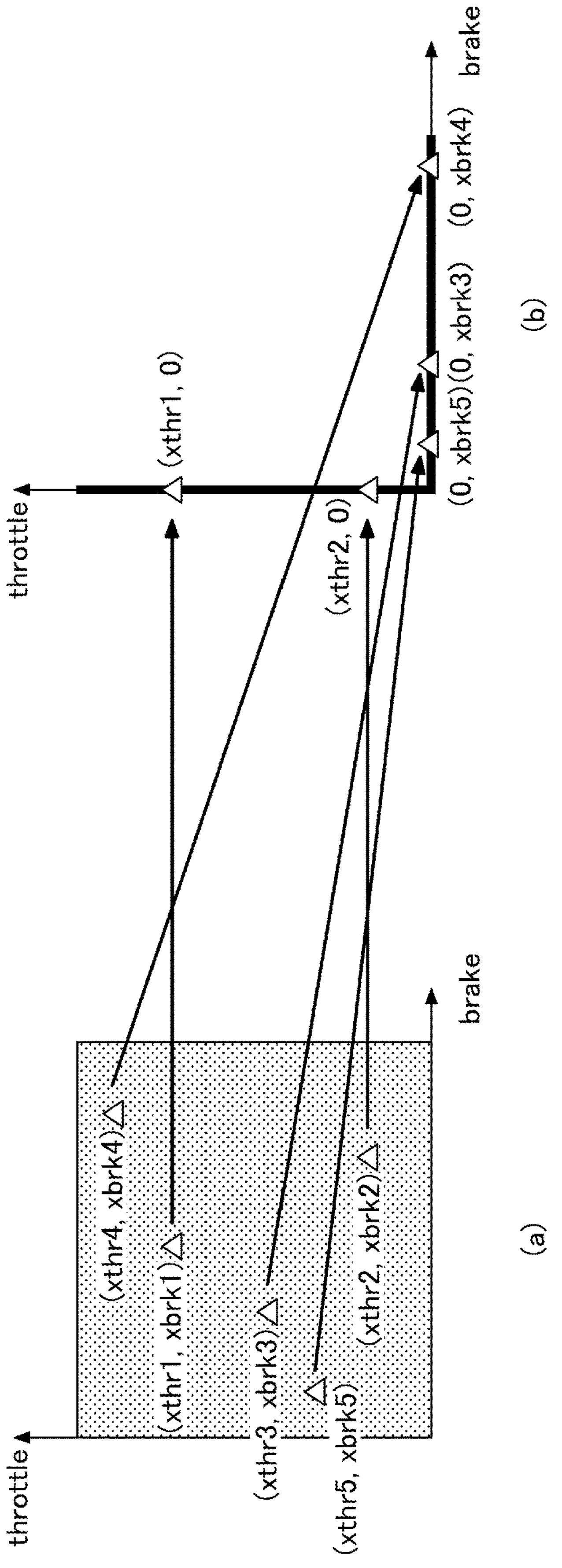
FIG. 8 is a schematic diagram illustrating a proportional transformation according to the embodiment of the present disclosure.

However, the axis priority given as the hyperparameter is not required to be defined as either the accelerator axis or the brake axis, and may be defined for each sample. For example, as illustrated in FIG. 8, the samples 1 and 2 may be transformed to prioritize the accelerator axis, and the samples 3, 4, and 5 may be transformed to prioritize the brake axis.

The counterexample determining unit 130 may determine whether the output M(u) of the model M for the input u satisfies the specification φ, and if the output M(u) does not satisfy the specification φ, the input u may be determined as the counterexample u*. Specifically, the counterexample determining unit 130 simulates the model M for the input u acquired from the space transforming unit 120 and acquires the output M(u). For example, if the model M is an automotive control model, the model M outputs a parameter value, such as the automobile speed, for the input u of the accelerator value or the brake value that satisfies the constraint ψ.

In one embodiment, when the output M(u) of the model M is acquired, the counterexample determining unit 130 may determine the degree of satisfaction of the output M(u) with respect to the specification φ by using a robustness function r that derives the degree of satisfaction with respect to the specification φ based on the output M(u) and the specification φ. Here, the robustness function r may be any suitable function that outputs a value indicating the degree to which the output M(u) satisfies the specification φ. If the robustness value is less than a predetermined threshold value, such as 0, the input u does not satisfy the specification φ and may be determined as the counterexample u*. If the robustness value is greater than or equal to the predetermined threshold value and has a relatively large value, it is determined that the input u satisfies the specification φ with a high degree of satisfaction, and if the robustness value is greater than or equal to the predetermined threshold value but has a relatively small value, it is determined that the input u satisfies the specification φ but has a low degree of satisfaction.

For example, such a robustness function r may be defined as follows.

$$r(M(u),\varphi) = (inf_{t\in[0,29]}(100 - w(t)(\text{speed}))) \vee (inf_{t\in[29,30]}(w(t)(\text{speed}) - 75)) \quad \text{[Formula 1]}$$

Here, w(t) (speed) indicates an automobile speed value of the output M(u) at time t. That is, if the output M(u) at the time t does not satisfy the specification φ, then the robustness value is negative. Additionally, as the degree of satisfaction of the output M(u) at the time t that satisfies the specification φ increases, the robustness value increases, and as the degree of satisfaction of the output M(u) at the time t that satisfies the specification φ decreases, the robustness value becomes closer to 0. With respect to a method of deriving such a robustness value, see, for example, A. Donze and O. Maler, "Robust Satisfaction of temporal logic over real-valued signals," in Proc. $8^{th}$ Int. Conf. Formal Model. Anal. Timed Syst. vol. 6246, 2010, pp. 92-106.

If the output M(u) does not satisfy the specification φ, the counterexample determining unit 130 determines the detected u as the counterexample u*, and determines that the model M does not satisfy the specification φ. If the output M(u) satisfies the specification φ, the counterexample determining unit 130 notifies the repeat control unit 140 of information indicating that the output M(u) satisfies the specification φ together with the robustness value indicating the degree of satisfaction of the output M(u).

If the output M(u) satisfies the specification φ, the repeat control unit 140 controls a repeating process that causes the sample extracting unit 110 to extract a next sample x' from the search space according to the predetermined search algorithm and activate the space transforming unit 120 and the counterexample determining unit 130 for the extracted sample x'. Specifically, if the output M(u) satisfies the specification φ, the repeat control unit 140 supplies the robustness value r of the output M(u) to the sample extracting unit 110, and the sample extracting unit 110 extracts the next sample x' based on the robustness value r according to the predetermined search algorithm.

Here, the search algorithm, such as hill climbing, is typically applied in the unconstrained search space and cannot be suitably applied in the constrained search spaces U. Thus, in the present disclosure, instead of applying the search algorithm in the constrained search space U, the model verification device 100 applies the search algorithm in the search space X, such as a hypercube or a hyperrectangle, and transforms the extracted sample into the point on the constrained search space U with the proportional transformation.

For example, if hill climbing is used as the predetermined search algorithm, the sample extracting unit 110 may search for a next sample $x_{i+1}$ in a direction in which the robustness value r decreases from a current sample $x_i$ the most. Additionally, the sample extracting unit 110 may extract the next sample $x_{i+1}$ based on not only the current sample $x_i$ but also on a history of past samples $x_{i-j}, x_{i-j+1}, \ldots, x_{i-1}, x_i$. For example, the next sample $x_{i+1}$ may be extracted based on regression of the past samples $x_{i-j}, x_{i-j+1}, \ldots, x_{i-1}, x_i$.

The repeat control unit 140 activates the space transforming unit 120 and the counterexample determining unit 130 to repeat the above-described processes in the space transforming unit 120 and the counterexample determining unit 130 for the next sample x' extracted by the sample extracting unit 110. Such repeated processes are repeated until the counterexample u* is detected or a predetermined termination condition is satisfied. Here, the predetermined termination condition may be a condition that the repeated processes have been performed for a predetermined number of sampling times, or the like.

[Model Verification Process]

Figure 9:
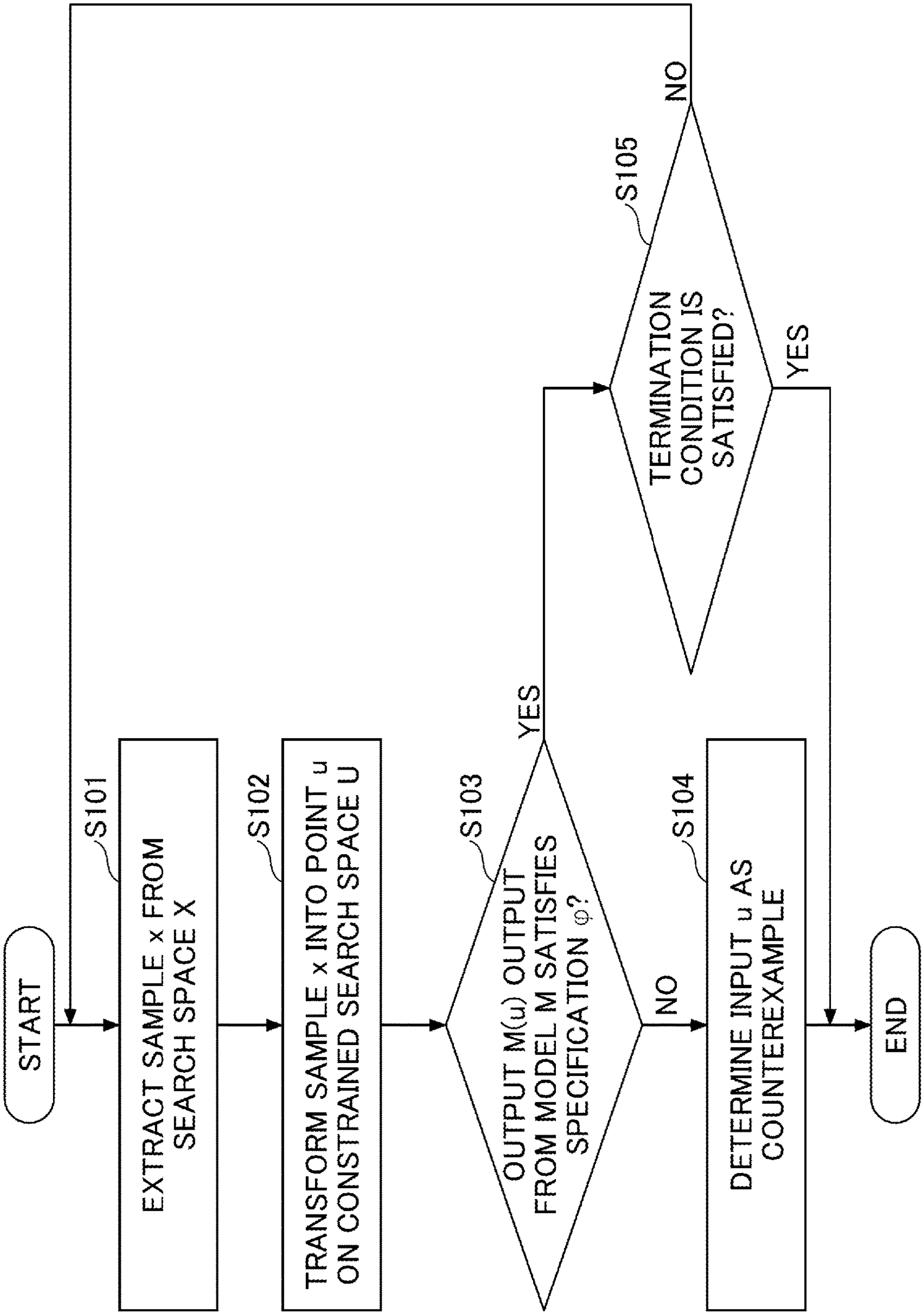
FIG. 9 is a flowchart illustrating a model verification process according to the embodiment of the present disclosure.

Next, a model verification process according to the embodiment of the present disclosure will be described with reference to FIG. 9. The following model verification process searches for the counterexample u* that generates the output M(u) of the model M that does not satisfy the specification φ on the constrained search space U to which the constraint ψ is applied. The model verification process may be performed by the model verification device 100 described above, for example, by one or more processors executing a program stored in one or more memories of the model verification device 100. FIG. 9 is a flowchart illustrating the model verification process according to the embodiment of the present disclosure.

As illustrated in FIG. 9, in step S101, the model verification device 100 extracts the sample x from the search space X. For example, the search space X may be a space suitable for applying the search algorithm, such as a hypercube or a hyperrectangle having the same dimensions as the sample x. Initially, the model verification device 100 may randomly extract the sample x from the search space X.

In step S102, the model verification device 100 transforms the sample x into the point u on the constrained search space U according to the transformation rule. For example, the transformation rule may be a surjective function that maps any point on the search space X to a corresponding point among the points on the constrained search space U to which the constraint ψ is applied, and for example, may be a proportional transformation. If the transformation rule is a proportional transformation, the model verification device 100 may transform each component $x_k$ of the sample x, with respect to the specified axial direction according to the axial priority given as the hyperparameter. As in the above-described specific example of the accelerator and the brake, if the constrained search space U is formed as an area on the axis, the model verification device 100 maps each component $x_k$ of the sample x to a point on the accelerator axis or the brake axis.

Specifically, when the sample x=(xthr1, xbrk1, xthr2, xbrk2, xthr3, xbrk3, xthr4, xbrk4, xthr5, xbrk5) and a hyperparameter (e.g. (1, 0, 1, 0, 1, 0, 1, 0, 1, 0) or the like) that prioritizes the acceleration axis are given, the model verification device 100 performs the proportional transformation on the sample x to transform the sample x into u=(xthr1, 0, xthr2, 0, xthr3, 0, xthr4, 0, xthr5, 0).

When the sample x=(xthr1, xbrk1, xthr2, xbrk2, xthr3, xbrk3, xthr4, xbrk4, xthr5, xbrk5) and a hyperparameter (e.g. (0, 1, 0, 1, 0, 1, 0, 1, 0, 1) or the like) that prioritizes the brake axis are given, the model verification device 100 performs the proportional transformation on the sample x to transform the sample x into u=(0, xbrk1, 0, xbrk2, 0, xbrk3, 0, xbrk4, 0, xbrk5).

When the sample x=(xthr1, xbrk1, xthr2, xbrk2, xthr3, xbrk3, xthr4, xbrk4, xthr5, xbrk5) and a hyperparameter (1, 0, 0, 1, 0, 1, 1, 0, 1, 0) are given, the model verification device 100 performs the proportional transformation on the sample x to transform the sample x into u=(xthr1, 0, 0, xbrk2, 0, xbrk3, xthr4, 0, xthr5, 0).

Here, if the search space X is formed as a normalized hypercube or the like, the hyperparameter may be appropriately multiplied by a scalar.

In step S103, the model verification device 100 determines whether the output M(u) of the model M satisfies the specification φ. For example, in the above-described specific example of the accelerator and the brake, the model verification device 100 simulates the model M with respect to the input u and determines whether the output M(u) of the model M satisfies the specification φ "the automobile speed is always less than 100 from 0 to 29 seconds or the automobile speed is always greater than 75 from 29 to 30 seconds ($alw_{[0,29]}$ (speed <100)$\vee$$alw_{[29,30]}$ (speed >75)". If the automobile speed is greater than or equal to 100 from 0 to 29 seconds or the automobile speed is less than or equal to 75 from 29 to 30 seconds according to the output M(u*), the model verification device 100 determines the input u* as the counterexample of the model M and determines that the model M does not satisfy the specification φ. If the automobile speed is less than 100 from 0 to 29 seconds and the automobile speed is greater than 75 from 29 to 30 seconds according to the output M(u) for any trial input u, the model verification device 100 determines that the model M satisfies the specification φ.

Additionally, the model verification device 100 may determine the degree of satisfaction of the output M(u) with respect to the specification φ by using the robustness function r that derives the degree of satisfaction with respect to the specification φ based on the output M(u) and the specification φ. For example, the model verification device 100 may determine that the output M(u) satisfies the specification φ when a robustness value indicating the degree of satisfaction of the output M(u) with respect to the specification φ is greater than or equal to a predetermined threshold value (e.g., 0), and may determine that the output M(u) does not satisfy the specification φ when the robustness value is less than the predetermined threshold value.

If the output M(u) does not satisfy the specification φ (S103:NO), the model verification device 100 determines the input u as the counterexample in step S104, determines that the model M does not satisfy the specification φ, and ends the model verification process.

If the output M(u) satisfies the specification φ (S103: YES), the model verification device 100 determines whether the termination condition of the model verification process is satisfied in step S105. If the termination condition is satisfied (S105:YES), the model verification device 100 determines that the model M satisfies the specification φ and ends the model verification process.

If the termination condition is not satisfied (S105:NO), the model verification device 100 returns to step S101 and extracts the next sample x' from the search space X. At this time, the model verification device 100 may extract the next sample x' according to the search algorithm based on the degree of satisfaction of the output M(u) of the model M with respect to the sample x. For example, if hill climbing is used as the search algorithm, the model verification device 100 may extract the next sample x' in the direction in which the degree of satisfaction or the robustness value decreases the most. Additionally, the model verification device 100 may use the history of past samples $x_{i-j}, \ldots, x_i$ in addition to the current sample $x_i$ to extract the next sample $x_{i+1}$.

While the embodiments of the present invention have been described in detail above, the present invention is not limited to the specific embodiments described above, and various modifications and alterations can be made within the scope of the subject matter of the present invention recited in the claims.

What is claimed is:

1. A model verification device comprising:

a memory; and a processor coupled to the memory and configured to:

extract a sample from a search space;

transform the extracted sample into an input on a constrained search space to which a constraint with respect to a model of a cyber-physical system is applied, according to a predetermined transform rule, the model being configured to output a parameter related to an engine of a physical entity in the cyber-physical system as an output of the model, wherein the predetermined transform rule includes an axial priority with respect to an axial direction of a component of the extracted sample, and the processor is configured to transform the extracted sample into the input based on the axial priority to satisfy the constraint;

acquire the output of the model by inputting the input into the model, determine whether the output of the model for the input satisfies a specification, and determine the input as a counterexample when the output does not satisfy the specification, modify the model based on the determined counterexample, control a speed of the physical entity of the cyber-physical system based on a parameter related to the engine output from the modified model, and control, when the output of the model satisfies the specification, a repeating process of extracting a next sample from the search space according to a predetermined search algorithm and starting the transforming and the determining with respect to the extracted next sample, wherein the predetermined search algorithm is hill climbing, and wherein the processor is configured to identify the next sample based on the axial priority used for the extracted sample.

2. The model verification device as claimed in claim 1, wherein the search space is formed as a hypercube or a hyperrectangle, wherein the predetermined transform rule is a proportional transformation, and wherein the axial priority is defined for each sample extracted from the search space.

3. The model verification device as claimed in claim 1, wherein the processor repeats the repeating process until the counterexample is detected or a predetermined terminal condition is satisfied.

4. The model verification device as claimed in claim 1, wherein the processor uses a robustness function that derives a degree of satisfaction with respect to the specification based on the output and the specification to determine the degree of satisfaction of the output with respect to the specification.

5. The model verification device as claimed in claim 1, wherein the processor extracts the next sample based on a history of a robustness value for the extracted sample and the axial priority used for the extracted sample.

6. The model verification device as claimed in claim 1, wherein the processor is configured to transform the extracted sample into the input based on the axial priority to satisfy the constraint such that the component of the extracted sample is mapped to a point on an axis that is prioritized.

7. A model verification method comprising:

extracting, by a processor, a sample from a search space;

transforming, by the processor, the extracted sample into an input on a constrained search space to which a constraint with respect to a model of a cyber-physical system is applied, according to a predetermined transform rule, the model being configured to output a parameter related to an engine of a physical entity in the cyber-physical system as an output of the model, wherein the predetermined transform rule includes an axial priority with respect to an axial direction of a component of the extracted sample, and the processor is configured to transform the extracted sample into the input based on the axial priority to satisfy the constraint;

acquiring, by the processor, the output of the model by inputting the input into the model, and determining, by the processor, whether the output of the model for the input satisfies a specification, and determining the input as a counterexample when the output does not satisfy the specification, modifying, by the processor, the model based on the determined counterexample, controlling, by the processor, a speed of the physical entity of the cyber-physical system based on a parameter related to the engine output from the modified model, and controlling, by the processor, when the output of the model satisfies the specification, a repeating process of extracting a next sample from the search space according to a predetermined search algorithm and starting the transforming and the determining with respect to the extracted next sample, wherein the predetermined search algorithm is hill climbing, and wherein the next sample is identified based on the axial priority used for the extracted sample.

* * * * *